US010153372B2

United States Patent
Cea et al.

(10) Patent No.: US 10,153,372 B2
(45) Date of Patent: Dec. 11, 2018

(54) HIGH MOBILITY STRAINED CHANNELS FOR FIN-BASED NMOS TRANSISTORS

(71) Applicant: INTEL CORPORATION, Santa Clara, CA (US)

(72) Inventors: Stephen M. Cea, Hillsboro, OR (US);
Roza Kotlyar, Portland, OR (US);
Harold W. Kennel, Portland, OR (US);
Glenn A. Glass, Portland, OR (US);
Anand S. Murthy, Portland, OR (US);
Willy Rachmady, Beaverton, OR (US);
Tahir Ghani, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/117,590

(22) PCT Filed: Mar. 27, 2014

(86) PCT No.: PCT/US2014/032039
§ 371 (c)(1),
(2) Date: Aug. 9, 2016

(87) PCT Pub. No.: WO2015/147836
PCT Pub. Date: Oct. 1, 2015

(65) Prior Publication Data
US 2016/0351701 A1 Dec. 1, 2016

(51) Int. Cl.
*H01L 29/78* (2006.01)
*H01L 29/66* (2006.01)
(Continued)

(52) U.S. Cl.
CPC ........ *H01L 29/785* (2013.01); *H01L 27/0924* (2013.01); *H01L 29/045* (2013.01);
(Continued)

(58) Field of Classification Search
CPC .. H01L 29/785; H01L 29/045; H01L 29/1045
See application file for complete search history.

(56) References Cited

U.S. PATENT DOCUMENTS 6,475,869 B1  11/2002  Yu
8,017,463 B2   9/2011  Chang
(Continued)

FOREIGN PATENT DOCUMENTS

WO    2015147836 A1    10/2015

OTHER PUBLICATIONS

International Search Report and Written Opinion as received for Patent Application No. PCT/US2014/032039, dated Dec. 10, 2014, 13 pages.
(Continued)

*Primary Examiner* — Jamie C Niesz
(74) *Attorney, Agent, or Firm* — Finch & Maloney PLLC

(57) ABSTRACT

Techniques are disclosed for incorporating high mobility strained channels into fin-based NMOS transistors (e.g., FinFETs such as double-gate, trigate, etc), wherein a stress material is cladded onto the channel area of the fin. In one example embodiment, a germanium or silicon germanium film is cladded onto silicon fins in order to provide a desired tensile strain in the core of the fin, although other fin and cladding materials can be used. The techniques are compatible with typical process flows, and cladding deposition can occur at a plurality of locations within typical process flow. In various embodiments, fins may be formed with a minimum width (or later thinned) so as to improve transistor performance. In some embodiments, a thinned fin also increases tensile strain across the core of a cladded fin. In some cases, strain in the core may be further enhanced by adding an embedded silicon epitaxial source and drain.

25 Claims, 9 Drawing Sheets

(51) Int. Cl.
*H01L 29/10* (2006.01)
*H01L 27/092* (2006.01)
*H01L 29/04* (2006.01)
*H01L 29/06* (2006.01)
*H01L 29/161* (2006.01)
*H01L 29/165* (2006.01)

(52) U.S. Cl.
CPC ...... *H01L 29/0649* (2013.01); *H01L 29/1054* (2013.01); *H01L 29/161* (2013.01); *H01L 29/66545* (2013.01); *H01L 29/66818* (2013.01); *H01L 29/165* (2013.01)

(56) References Cited

U.S. PATENT DOCUMENTS

| | | |
|---|---|---|
| 8,501,607 B1 | 8/2013 | Juengling |
| 2006/0033095 A1 | 2/2006 | Doyle et al. |
| 2007/0090416 A1 | 4/2007 | Doyle et al. |
| 2008/0157130 A1 | 7/2008 | Chang |
| 2008/0308847 A1 | 12/2008 | Xiong et al. |
| 2011/0303983 A1 | 12/2011 | Basker et al. |
| 2012/0025312 A1 | 2/2012 | Scheiper et al. |
| 2012/0319211 A1* | 12/2012 | van Dal ............ H01L 29/66795 257/401 |
| 2013/0071980 A1 | 3/2013 | Lin et al. |
| 2013/0187242 A1 | 7/2013 | Tan et al. |
| 2014/0027816 A1* | 1/2014 | Cea .................. H01L 29/66545 257/192 |
| 2014/0264488 A1* | 9/2014 | Fronheiser ........ H01L 29/66795 257/288 |
| 2016/0190319 A1* | 6/2016 | Kavalieros ............ H01L 29/267 257/190 |

OTHER PUBLICATIONS

Office Action and Search Report received for TW Application No. 104104231, dated Mar. 9, 2016. 18 pages; including 9 pages of English translation.

Office Action and Search Report received for TW Application No. 104104231, dated Nov. 7, 2016. 18 pages; including 9 pages of English translation.

International Preliminary Report on Patentability as received for Patent Application No. PCT/US2014/032039, dated Oct. 6, 2016. 10 pages.

Taiwan Office Action received for TW Application No. 104104231. Dated Oct. 30, 2017. 11 pages.

Extended European Search Report received for EP Application No. 14887192.4, dated Oct. 19, 2017. 7 pages.

* cited by examiner

HIGH MOBILITY STRAINED CHANNELS FOR FIN-BASED NMOS TRANSISTORS

BACKGROUND

Increased performance and yield of circuit devices on a substrate, including transistors, diodes, resistors, capacitors, and other passive and active electronic devices formed on a semiconductor substrate, are typically a major factor considered during design, manufacture, and operation of those devices. For example, during design and manufacture or forming of metal-oxide-semiconductor (MOS) transistor semiconductor devices, such as those used in complementary metal-oxide-semiconductor (CMOS) devices, it is often desired to increase movement of electrons (carriers) in N-type MOS device (NMOS) channels and to increase movement of positive charged holes (carriers) in P-type MOS device (PMOS) channels. Finned transistor configurations include a transistor built around a thin strip of semiconductor materials (generally referred to as the fin). The transistor includes the standard field effect transistor (FET) nodes, including a gate, a gate dielectric, a source region, and a drain region. The conductive channel of the device effectively resides on the outer sides of the fin, beneath the gate dielectric. Specifically, current runs along/within both sidewalls of the fin (sides substantially perpendicular to the substrate surface) as well as along the top of the fin (side substantially parallel to the substrate surface). Because the conductive channel of such configurations essentially resides along the three different outer, planar regions of the fin, such configurations have been termed as FinFET and tri-gate transistors. Other types of finned configurations can also be used, such as so-called double-gate FinFETs, in which the conductive channel principally resides only along the two sidewalls of the fin (and not along the top of the fin, for example).

DETAILED DESCRIPTION

Figure 1:
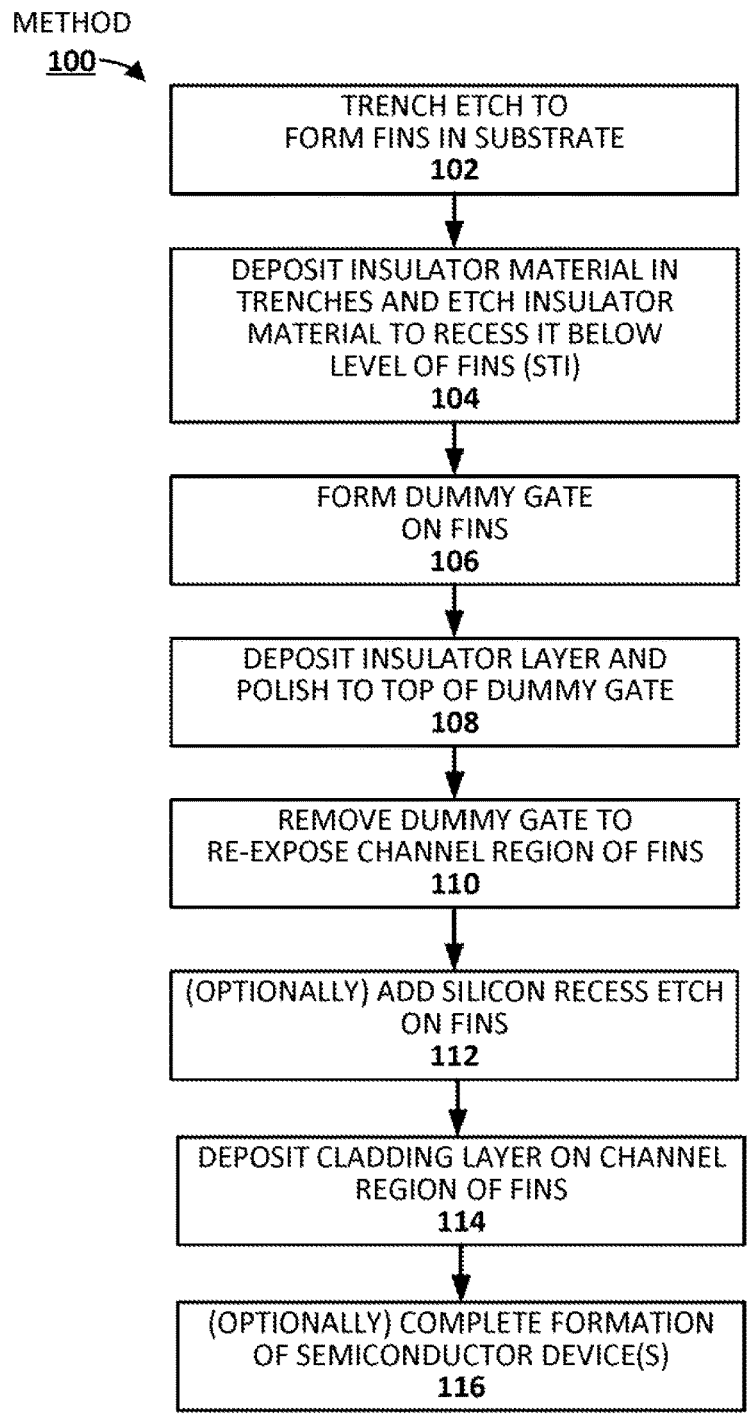
FIG. 1 shows a method of forming NMOS finned transistor device(s) including, cladding a channel region of the fins, in accordance with one or more embodiments of the present disclosure.

Techniques are disclosed for incorporating high mobility strained channels into fin-based NMOS transistors (e.g., FinFETs such as double-gate, trigate, etc), wherein a stress material is cladded onto the channel area of the fin. In one example embodiment, a germanium (Ge) or silicon germanium (SiGe) film is cladded onto silicon fins in order to provide a desired tensile strain in the core of the fin, although other fin and cladding materials can be used. The techniques are compatible with typical process flows, and the cladding deposition can occur at a plurality of locations within typical process flow. In various embodiments, fins may be formed with a minimum width (or later thinned) so as to improve transistor performance. In some embodiments, a thinned fin also increases the tensile strain across the core of a cladded fin. In some cases, strain in the core may be further enhanced by adding an embedded silicon (Si) epitaxial source and drain.

General Overview

There are a number of non-trivial issues associated with fabricating FinFETs. For instance, high mobility PMOS channels have been engineered using strained Ge or SiGe cladding layers over channel regions. However, typical process flows generally include an integration scheme (e.g., photolithography), or post-deposition etching, which prevent Ge or SiGe layers from forming on NMOS regions of fins. The reason for this can be understood by comparing carrier behavior between PMOS and NMOS devices. In the context of a PMOS device, carriers (positively charged holes) tend to reside and conduct predominately at the surface of the channel (e.g., right next to the gate oxide layer). When a compressive cladding (e.g., Ge or SiGe) is applied to the channel, the cladding provides a transport with enhanced carrier mobility due to the strain state. In the context of NMOS devices, carriers (e.g., electrons) tend to favor Si layers and conduct within the Si regions (such as the core of a fin). For this reason, applying a compressive cladding layer to an NMOS device, without further consideration, may provide negligible mobility enhancement due to tensile strain in the Si core of a fin. However, and as will be appreciated in light of this disclosure, to modulate carrier mobility in an NMOS device to measurably or otherwise favorably enhance mobility includes consideration of not only strain but also channel width, composition, and substrate (crystal) orientation.

Thus, and in accordance with an embodiment of the present disclosure, a cladding layer is applied to a channel of an NMOS device by depositing a SiGe or Ge cladding layer thereon. The cladding layer, for example, is composed such that tensile strain occurs within the Si core of a fin. In some embodiments, fins are formed on a (110) oriented silicon wafer and are formed to have an initial width (e.g., 4 nm or less). Having a fin with a minimal width enables a relatively thin layer (e.g., 2 nm or less) of cladding to transfer substantial tensile strain to the Si core. In addition, a thin fin with a thin layer of cladding generally results in an overall relatively thin width, which may further improve transistor performance and scalability.

In various embodiments, the cladding process could occur at various times in the flow including after trench etch during fin formation, after shallow trench isolation (STI) material recess to expose the fins, before adding a dummy gate (assuming a replacement gate flow), and after removal of the dummy gate. In this sense, the cladding deposition process and the overall process flow are highly compatible. Although a selective process route insures a minimal amount of Ge-rich material is deposited, non-selective routes may be used in forming the cladding layer. In some embodiments, tensile strain in the fin is enhanced by adding an embedded Si epitaxial source and drain. Similar to the application of a cladding layer, adding an embedded Si epitaxial source and drain may be performed at various times in the flow, including prior to a replacement gate process. In one embodiment, the cladding layer has a germanium concentration ranging from, for example, 10-100 atomic %, including pure epitaxial Ge. In some such embodiments, an optional cap of, for instance, silicon can be provided in a selective or non-selective fashion over the cladding layer to improve the interface between the semiconductor channel and the gate dielectric layer (which may be, for instance, a high-k dielectric).

Once the fins are formed and the SiGe cladding layer has been provided in the channel area (which may occur at one or more times during the process), a FinFET transistor process flow can be executed to fabricate, for instance, high-k metal gate transistors. Any number of transistor types and/or formation process flows may benefit from the channel strain techniques provided herein, such NMOS transistors or CMOS configurations that include both PMOS and NMOS transistors within the same flow, whether configured with thin or thick gates, and with any number of geometries. In some embodiments including a source/drain recess process, the strain (and the mobility) in the fin core can be further increased for isolated devices. This enhancement in strain, is due to the free surface created during the shallow trench isolation process which effectively allows the Ge-containing cladding layer to relax elastically, increasing the tensile strain along the current flow direction in the fin core. In addition, performing source/drain recess and filling with epitaxially grown Si may also increase the tensile strain along the current flow direction in the fin core. The amount of final tensile strain may depend on the quality of the epitaxial Si source/drain and the defects therein that enable a higher tensile strain due to more elastic relaxation of the Ge, and thus, more stretching (e.g., strain) in the fin core.

As will be further appreciated, numerous material systems can benefit from the techniques described herein, as will be apparent in light of this disclosure, and the present disclosure is not intended to be limited to any particular one or set. Rather, the techniques can be employed wherever core strain is helpful.

The techniques can be embodied, for example, in any number of integrated circuits, such memories and processors and other such devices that are fabricated with transistors and other active junction semiconductor devices, as well as in methodologies suitable for practice at fabs where integrated circuits are made. Use of the techniques described herein manifest in a structural way. For instance, a cross-section image of transistors formed in accordance with an embodiment, such as an image provided with a transmission electron microscope (TEM), demonstrate a cladding layer on the channel portion of the fin, as compared to a conventional fin-based transistors. Likewise, composition mapping may reveal N-doped source drain regions with a Ge-containing cladding layer or a Si fin, for example.

Variations on incorporating high mobility strained channels onto fin-based devices will be apparent in light of this disclosure. For instance, in one embodiment, fins may be native to the substrate (and therefore the same material as the substrate) or may be formed on the substrate.

Fin Structure

FIG. 1 shows a method 100 of forming NMOS finned transistor device(s) including depositing a cladding layer on to the channel region of the fins, in accordance with one or more embodiments of the present disclosure. As discussed above, cladding the channel region of the fins can occur at various times during a flow including after trench etch during fin formation, after shallow trench isolation (STI) material excess to expose the fins, before adding a dummy gate, and after removal of the sacrificial (or dummy) gate stack. Although embodiments discussed below include depositing of a cladding layer after removal of the dummy gate stack, this should not be viewed as limiting in the present disclosure. FIGS. 2-10 illustrate example structures that are formed as the process flow or method 100 of FIG. 1 is carried out, in accordance with some embodiments. Although method 100 of FIG. 1 and the structures shown in FIGS. 2-10 are depicted and described herein in the context of finned transistor configurations (e.g., tri-gate or FinFET), similar principles and techniques as variously described herein may be used for other semiconductor devices and transistor configurations, including, for example, dual-gate, gate-all-around (e.g., nanowire/nanoribbon), and other suitable devices and configurations, as will be apparent in light of this disclosure.

Figure 2:
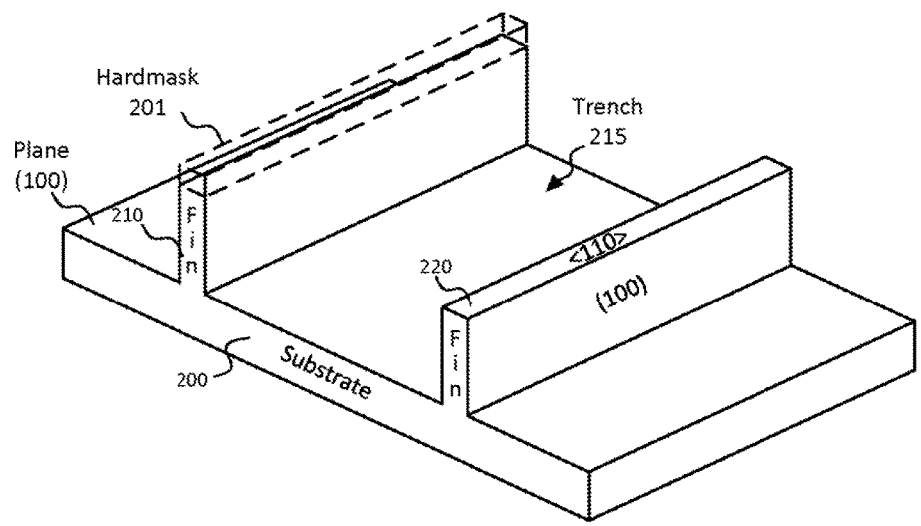
FIG. 2 illustrates a perspective view of semiconductor substrate including fins after trench etch vas performed on a (110) oriented wafer, in accordance with an embodiment.

FIG. 2 illustrates a perspective view of semiconductor substrate 200 including fins 210 and 220 after trench etch 102 was performed on a (110) oriented wafer to form fins 210 and 220 in substrate 200, in accordance with an embodiment. As shown, the fins 210 and 220 are configured with a <110> channel orientation. In some cases, method 100 may include initially providing substrate 200 such that trench etch 102 can be performed on the provided substrate 200. In one specific example case, the substrate is a bulk silicon substrate. In another example case, the substrate is a silicon on insulator (SOI) substrate. In another example case, the substrate is a bulk SiGe substrate. In another example case, the substrate is a multilayered substrate having a SiGe layer on a silicon layer. In another example case, the substrate is a SiGe on insulator (SiGeOI) substrate. Any number of configurations can be used, as will be apparent.

With further reference to FIG. 2, and as previously described, fins 210 and 220 were formed in substrate 200 after trench etch 102 was performed. Therefore, in this embodiment, fins 210 and 220 are formed on and from substrate 200. In some cases, trench etch 102 may include patterning and etching a thickness of substrate 200 using a resist or hardmask 201 to form fins 210 and 220. In some such cases, multiple resist or hardmask layers may be used for the patterning materials. In one example embodiment, the resulting hardmask 201 is a standard two-layer hardmask configured with a bottom layer of oxide and top layer of silicon nitride. Any number of suitable hardmask configurations can be used, as will be apparent.

As can be seen in FIG. 2, shallow trenches 215 were etched into the substrate 200 to form the fins 210 and 220. The shallow trench etch, can be accomplished with standard photolithography include wet or dry etching, or a combination of etches if so desired. In addition, double or quad patterning can be used to form thinner fins and/or tighter fin pitches than can be done with standard photolithography. The geometry of trench 215 (width, depth, shape, etc) can vary from one embodiment to the next as will be appreciated, and the present disclosure is not intended to be limited to any particular trench geometry. In one specific example embodiment having a silicon substrate and a two-layer hardmask implemented with a bottom oxide layer and a top silicon nitride (SiN) layer, a dry etch is used to form the trenches that are about 100 Å to 5000 Å below the top surface of the substrate. Any number of trench (or fin) configurations can be used, as will be apparent. After the fins are formed, the hardmask 201 can be removed. Such complete removal of the hardmask 201 allows for the top of the fin to be cladded so as to form tri-gate structures. In other embodiments, however, note that some of the hardmask 201 may be left behind, so that only sides of the fin are cladded (and not the top) so as to provide a double-gate structure. While the illustrated embodiment shows fins as having a width that does not vary with distance from the substrate, fins may be narrower at the top than the bottom in another embodiment, wider at the top than the bottom in another embodiment, or having any other width variations and degrees of uniformity (or non-uniformity). Further note that the width variation may, in some embodiments, be symmetrical or asymmetrical. Also, while the fins 210 and 220 are illustrated as all having the same width, some fins may be wider and/or otherwise shaped differently than others. For example, in accordance with an embodiment including both NMOS and PMOS devices, fins to be used in the creation of NMOS transistors may be narrower than fins to be used in the creation of PMOS transistors.

In other embodiments, the fins can be, for example, epitaxially grown such as described in U.S. Pat. No. 8,017,463, titled, "Epitaxial Fabrication of Fins for FinFET Devices." in such cases, a fin is effectively formed as a layer in the manufacturing, process. By forming, a fin layer, fin thickness is determined through control of the process parameters used to form the fin layer rather than photolithographic processes. For instance, if the fin is grown with an epitaxial process, the fin's thickness will be determined by the growth dynamics of the epitaxy. FinFETs whose fin widths are determined through layer formation rather than photolithography may offer improved minimum feature sizes and packing densities. In other embodiments, the fins can be fabricated by removal of material by cutting or ablation, for example, using laser, or other suitable tools capable of fine-cutting semiconductor materials. Resulting fin geometries will generally vary depending on formation techniques employed.

As will also be apparent in light of this disclosure, fins 210 and 220 may be used for N-type MOS devices (NMOS), P-type MOS devices (PMOS), or a CMOS device (e.g., where fin 210 will be an N-type MOS and fin 220 will be a P-type MOS), for example. Also note that although only two fins 210 and 220 (and trench 215 formed between) are shown for ease of description, any number of similar fins and trenches may be formed on substrate 200 (e.g., hundreds of fins, thousands of fins, millions of fins, etc.) and benefit from the techniques described herein.

Figure 3:
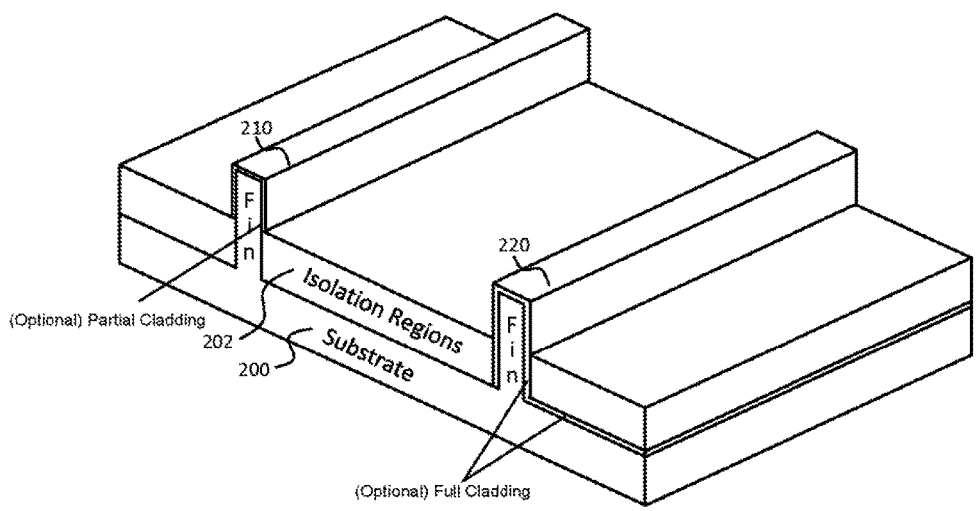
FIG. 3 illustrates a perspective view of the fin structure of FIG. 2 after depositing insulator material in the trenches and etching the insulator material to recess it below the level of fins, in accordance with an embodiment.

FIG. 3 illustrates a perspective view of the fin structure of FIG. 2 including shallow trench isolation (STI), provided by isolation regions 202, after depositing 104 insulator material in the trenches 215 and etching the insulator material to recess it below the level of fins 210 and 220, in accordance with an embodiment. In some embodiments, isolation regions 202 may comprise, for example, an insulator such as silicon dioxide ($SiO_2$) or other suitable insulator material. Deposition 104 to form isolation regions 202 may include atomic layer deposition (ALD), chemical vapor deposition (CVD), spin-on deposition (SOD), high-density plasma (HDP), plasma enhanced chemical deposition (PECVD), and/or some other suitable technique. In cases where patterning hardmask was used to form fins 210 and 220, the hardmask 201 (FIG. 2) can be removed prior to depositing the trench insulator material. In some cases, the insulator material may be polished flat (planarized) to the level of the top of fins 210 and 220, prior to etching the material to recess it below the level of fins 210 and 220. After planarization, any suitable etch process (e.g., wet and/or dry etch) can be used to recess the STI. These recessed regions provide isolation for the source/drain regions of the transistor. The depth of the recess can vary from embodiment to embodiment, depending on factors such as desired gate size and height of overall fin. In some example embodiments, the STI recess depth is such that 35% to 85% of the overall fin height is exposed, although other embodiments may remove more or less of the STI material, depending on what is suitable for the intended application.

In one embodiment, a Ge or SiGe cladding layer may be optionally deposited after trench etch 102 and before depositing 104 insulator material. For instance, in the embodiment illustrated in FIG. 3, note that fin 220 is shown with a cladding layer deposited before depositing 104 insulator material. In this instance the cladding may extend below the isolation regions 202. In such cases, further note that the subsequently grown or otherwise deposited insulator material (or so-called STI material) for filling the trenches 215 can be selected, for example, based on compatibility with the native oxide of the cladding. In another embodiment, fins may include a cladding layer deposited after the depositing 104 and recessing of the insulator material, such as shown with respect to fin 210. In the embodiment shown, cladding has been selectively applied to only the exposed surfaces of the Si fin 210. In other embodiments, cladding may be selectively applied to specific regions of a fin. For instance, only a channel region of a fin may be cladded, such as in an embodiment illustrated below in FIG. 8.

In one embodiment, after depositing 104 insulator material in the trenches 215 and etching the insulator material to recess it below the level of fins 210 and 220 a portion of the cladding layer is exposed (assuming a cladding layer was applied earlier in the flow). In this embodiment, so the planarization leaves at least a portion of the cladding layer on top of the fin. In this sense, the cladding layer can be used as an etch stop. In still other embodiments where hardmask material is left on top of the fins (for a double-gate configuration), a first layer of the hardmask (e.g., pad oxide) can be used as the etch stop, and which can also be used as a gate oxide if so desired. In still other such embodiments, the pad oxide can be completely removed, and a dummy oxide can be deposited before putting down the dummy gate material. In other embodiments, a high-k dielectric material can be deposited for the gate oxide at this time (or later in the process), as is sometimes done.

In some embodiments, the STI recess etching process at 104 may alter the thickness of the cladding layer that becomes exposed, such that the exposed portions of the cladding layer may be different (e.g., thinner) than the unexposed portions of the cladding layer. In some embodiments, the initial cladding layer thickness accounts for anticipated thinning due to subsequent processing. Further note that, in still other embodiments, the cladding layer may be provisioned with a non-uniform thickness, in effort to account for anticipated thinning in certain locations due to subsequent processing. For instance, the initial thickness in those certain locations may be thicker than the initial thickness in areas that will not be exposed to subsequent processing.

Although FIG. 3 shows two alternative embodiments where the cladding layer can be provisioned prior to dummy gate formation, the remainder of this example process flow will assume that the cladding layer is not yet deposited. As will be appreciated in light of this disclosure, the cladding layer can be provisioned at any number of locations within the process to provide advantages as variously indicated herein.

Figure 4:
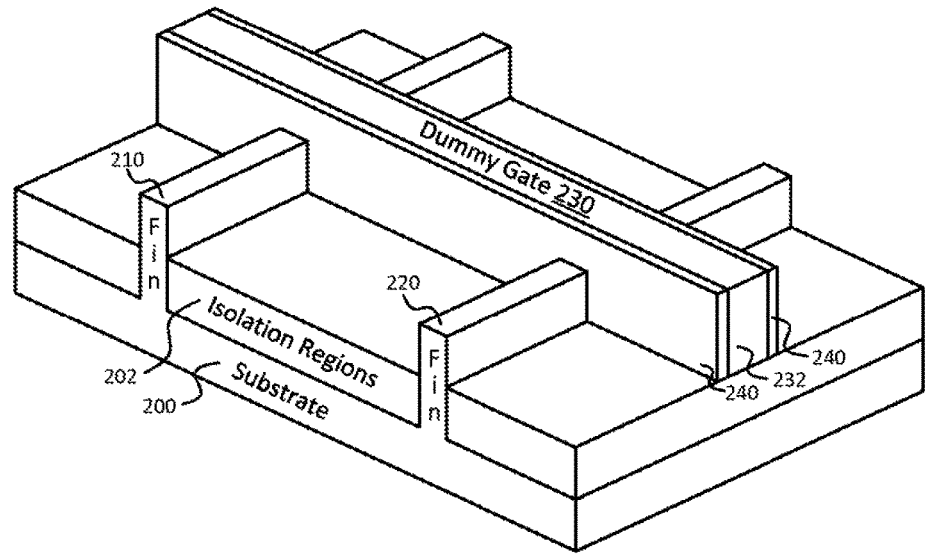
FIG. 4 illustrates a perspective view of the structure of FIG. 3 including a dummy gate after forming the same on fins, in accordance with an embodiment.

FIG. 4 illustrates a perspective view of the structure of FIG. 3 including dummy gate structure 230 after forming 106 the same on fins 210 and 220, in accordance with an embodiment. As previously described, the techniques disclosed herein for cladding fins 210 and 220 can be performed during the replacement gate process, which may also be known as a replacement metal gate (RMG) process. Such a selective deposition process may be suitable, for example, when there is a desire to conserve cladding material and therefore reduce material expense and/or to decrease integration complexity. Further note that fin shaping can also be performed selectively (e.g., in the channel regions only).

In one example embodiment, dummy gate structure 230 is implemented by first depositing a dummy gate dielectric/oxide (e.g., $SiO_2$) followed by a dummy gate electrode (e.g., dummy polysilicon). The resulting structure is generally designated as 232, and spacer material 240 can be deposited and etched to form the overall structure 230 shown in FIG. 4. In the embodiment shown, the top of the dummy gate electrode has been etched away. Such depositions, patterning, and etching can be done using any suitable techniques, as will be apparent. Note that dummy gate 230 is indicated on top of spacer material 240 for ease of reference, but further note that a dummy gate typically only includes the dummy gate oxide and dummy electrode layer.

Figure 5:
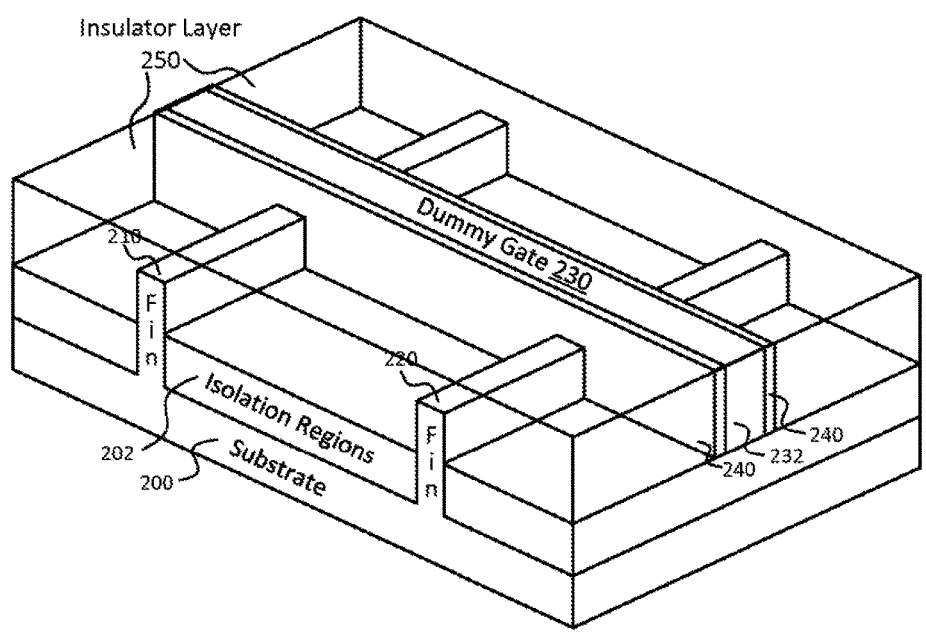
FIG. 5 illustrates a perspective view of the structure of FIG. 4 including an insulator layer after depositing the same and polishing the insulator layer to the top of the dummy gate, in accordance with an embodiment.

FIG. 5 illustrates a perspective view of the structure of FIG. 4 including insulator layer 250 after depositing 108 the same and polishing layer 250 to the top of dummy gate 230, in accordance with an embodiment. Insulator layer 250 may comprise any suitable insulator material, such as $SiO_2$, deposited by ALD, CVD, SOD, HDP, PECVD, and/or some other suitable technique.

Figure 6:
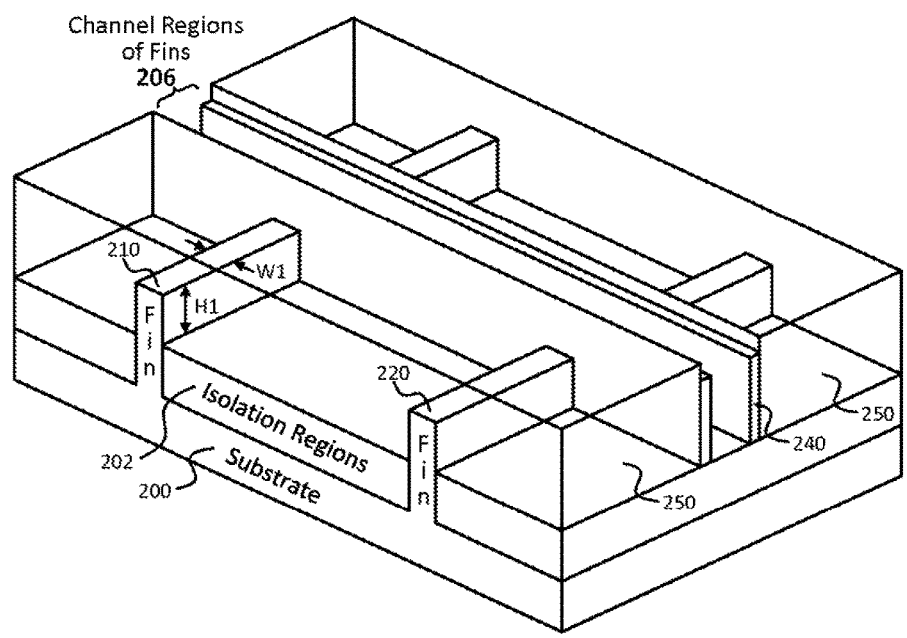
FIG. 6 illustrates a perspective view of the structure of FIG. 5 after removing the dummy gate to re-expose the channel region of the fins, in accordance with an embodiment.

FIG. 6 illustrates a perspective view of the structure of FIG. 5 after removing 110 dummy gate 230 to re-expose the channel region 206 of fins 210 and 220 (or what may become the channel region once the device is fully fabricated), in accordance with an embodiment. Removing 110 dummy gate 230, may include removing any capping layer (e.g., formed by spacer material 240) on top of the dummy gate structure 232, and then removing dummy gate electrode/poly-Si and dummy gate oxide. Such removal may be done using any suitable etch, polish, and/or clean process.

In the embodiment shown, channel region 206 of fins 210 and 220 has been re-exposed. As can be further seen, fins 210 and 220 include an initial width denoted as W1 and an initial height denoted as H1. Although fins 210 and 220 need not have the same initial width W1 and height H1, they are the same in this embodiment for ease of description. Note that first height H1 as used herein is the distance from the top of isolation region 202 to the top of the fins 210 and 220. Also note that, at this point in the example process flow, the source and drain regions of fins 210 and 220 (or what may become the source and drain regions once the device is fully fabricated) have the same initial/first width W1 and height H1 as the channel region 206 of fins 210 and 220. In some embodiments, and as will be apparent in light of this disclosure, the first width W1 may be determined by trench etch 104, which was performed to form fins 210 and 220 in substrate 200. As will be discussed below with reference to FIG. 7, further etching, or other suitable method, may be performed to selectively adjust fin width and/or height prior to disposition of any cladding material.

Figure 7:
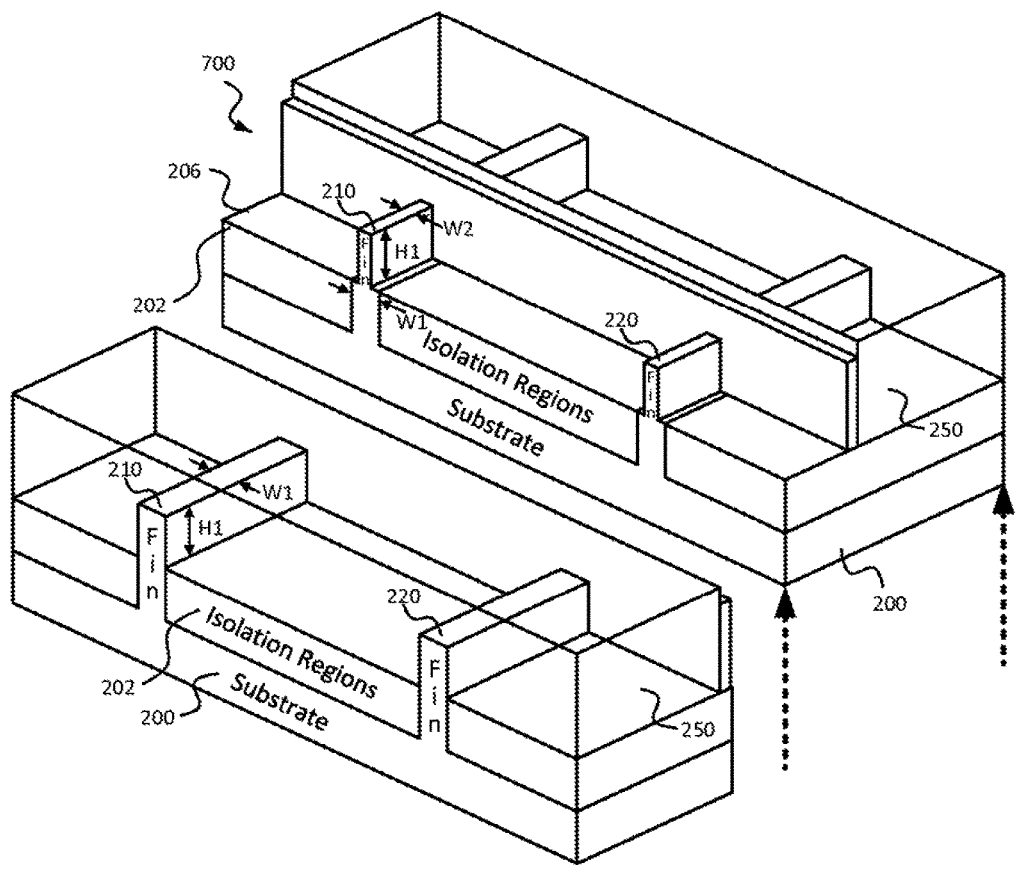
FIG. 7 continues from FIG. 6 and illustrates a perspective view of a cross-section of the substrate after performing an optional recess etch to the fins, in accordance with an embodiment.

FIG. 7 continues from FIG. 6 and illustrates a perspective view of a cross-section 700 of substrate 200 after adding an optional Si recess etch to fins 210 and 220, in accordance with an embodiment. In the embodiment shown, cross-section 700 is illustrated as a raised slice of substrate 200, to better show the recessed portion of the fins 210 and 220 in the channel region 206. The cross-section 700 is cut perpendicular to fins 210 and 220 in order to visualize otherwise obscured geometries of fins 210 and 220 after thinning by an Si recess etch. Such thinning is generally referred to herein as "necking" the fin. Various methods may be employed to implement the Si recess (e.g., isotropic etch), as will be apparent in light of this disclosure.

As shown in the embodiment of FIG. 7, thinning results in fins 210 and 220 having a second width denoted as W2. Although in the embodiment shown only the channel regions 206 of fins 210 and 220 were thinned, in other embodiments the entire fin may be thinned (including the source and drain regions). In these embodiments, thinning may be performed at various stages during a given flow such as during trench etch 102, for example. It should be noted that, in some examples, the height of the fins (H1) remains the same after necking. In other examples, the height of the fins may be reduced by etching or other suitable means as is apparent in light of this disclosure. This reduction in fin height may be intentional, but may also be a by-product of the thinning etch. Note that transistor performance can be increased by a thinner fin. As will be discussed below, a thin fin may also be advantageous for minimizing overall fin thickness (Si in addition to any cladding) and transferring tensile strain to the core of an Si fin.

Figure 8:
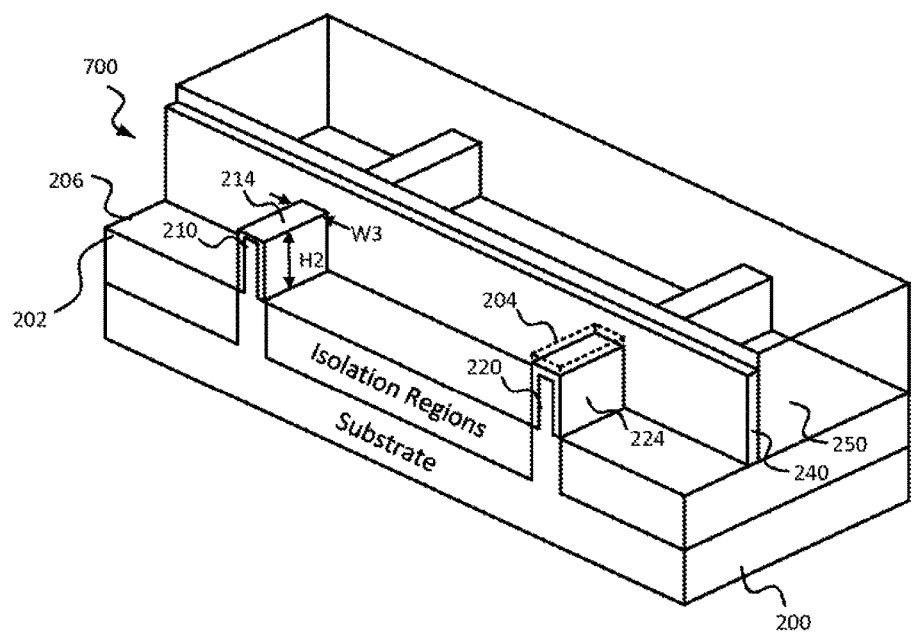
FIG. 8 continues from FIG. 7 and illustrates a resulting structure after depositing a cladding layer in the channel region on the fins, in accordance with an embodiment.

FIG. 8 continues from FIG. 7 and illustrates the resulting structure of cross-section 700 after depositing 112 cladding layer 214 and 224 in channel regions 206 of fins 210 and 212, respectively, in accordance with an embodiment. In some embodiments, deposition 112 may include using atomic layer epitaxy (ALE), CVD, metal-organic chemical vapor deposition (MOCVD), metal-organic vapor phase epitaxy (MOVPE), gas source-molecular beam epitaxy (GS-MBE), rapid thermal (RT)-CVD, ultra-high vacuum (UHV)-CVD, or some other suitable technique as will be apparent in light of this disclosure. In some embodiments, deposition 112 may be selective, such that cladding layer 214 and 224 is only deposited on or grows from the channel regions of fins 210 and 220, and not from the oxide materials (e.g., spacer 240 and insulator layer 250). In some such embodiments, growth conditions (such as growth temperature, pressure of gas flux, etc.), may define the selectivity of the epitaxial growth of cladding layer 214 and 224. In some embodiments where deposition 112 is selectively grown only on fins 210 and 220, the selective growth may be achieved using hardmasking or by forming oxide layers over the materials that are not desired to have the cladding material deposited thereon.

Note that in some embodiments, the cladding layer is free of crystalline defects such as stacking faults and dislocations. While such stacking faults and dislocations may be present at some acceptably low level, their presence above such a threshold may adversely impact the desired channel strain. In this sense, there is a trade between the germanium percentage and thickness of the cladding layer 214 and 224. This is because the overall dislocation free (strained) thickness is generally a product of composition and layer thickness. For example, given a SiGe cladding layer of 50% germanium, a cladding layer thickness of about 100 angstroms (Å) or less might be fully strained, but a SiGe cladding layer at 75% germanium might be limited to a cladding layer thickness of only about 50 Å or less before onset of defective deposition. Thus, in one specific embodiment, the cladding layer 214 and 224 is a SiGe alloy free of crystalline defects such as stacking faults and dislocations. As used herein, and in accordance with some such embodiments, 'free of crystalline defects' means that the defects in the cladding layer are less than 0.05% by volume or otherwise do not lead to unacceptable shorting/open (yield loss) and performance loss, as measured by a given suitable standard. Further note that the cladding layer critical thickness can vary greatly and these examples are not intended to limit the claimed disclosure to a particular range of layer thicknesses.

With further reference to FIG. 8, cladding layer 214 and 224 on fins 210 and 220 create a cladded fin having a third width (W3) and a second height (H2), in the shown embodiment. It should be understood that W3 and H2 may be the same width and height as W1 and H1, respectively, in FIG. 6. To this end, in one example, the addition of the cladding layer 214 and 224 may add additional width and height to the necked fin, but only to the extent of what was lost when Si was removed during necking and/or at some other stage of the flow. In other examples, W3 may be less than, equal to, or greater than W1. Likewise, in some embodiments, H2 may be less than, equal to, or greater than H1. In some embodiments, the thickness of cladding layers 214 and 224 may be of a thickness which causes tensile strain in the core of fins 210 and 220 without relaxation of the cladding layer 214 and 224.

As can be further seen in FIG. 8, an optional capping layer 204 can be deposited to protect the cladding layer 214 and 224 and/or to improve the gate dielectric/semiconductor interface. In one such embodiment, a silicon capping layer is deposited over a cladding layer, such as cladding layer 224. The deposition techniques for providing the optional capping layer 204 can be, for example, the same as those used in provisioning the cladding layer (e.g., CVD, RT-CVD, GS-MBE, etc). The thickness of the capping layer 204 can also vary from one embodiment to the next. In some cases, the capping layer 204 has a thickness in the range of 10 to 20 Å. In these cases, thickness may be determined with consideration that the capping layer 204 should be thick enough to improve dielectric interface but thin enough to not significantly reduce the strain the Si.

Figure 9:
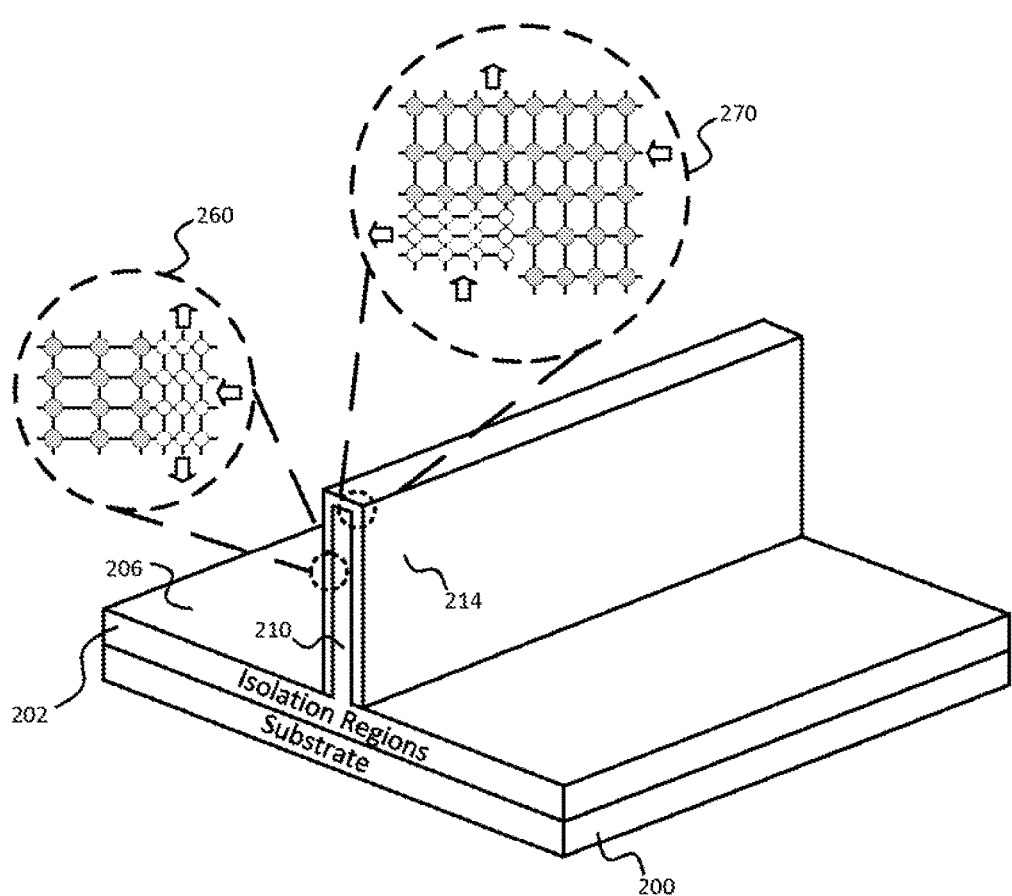
FIG. 9 illustrates a simplified representation of the structure of FIG. 8 and resulting vertical tensile strain in a fin caused by compressive cladding, in accordance with an embodiment.
Figure 10:
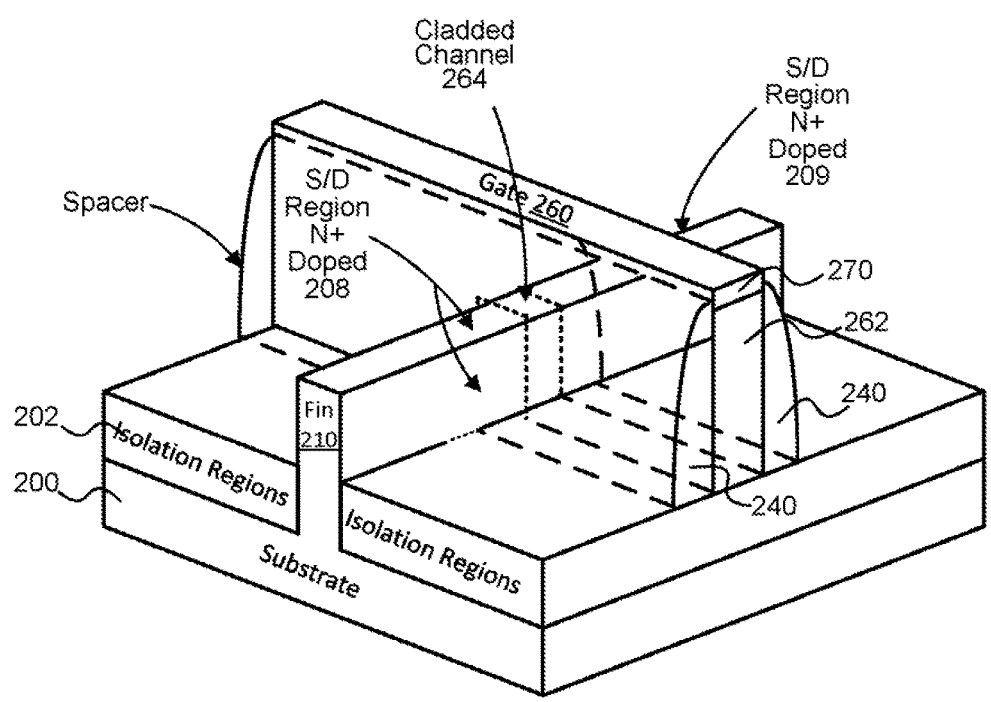
FIG. 10 illustrates a perspective view of the structure of FIGS. 6 and 7 after additional processing to form a semiconductor device e.g., after completing the replacement gate process and source/drain formation), in accordance with an embodiment.

After provisioning of the cladding layer 214 and 224 and optional capping layer 204, the flow may continue in a conventional manner, in some embodiments, or in custom or proprietary manner in still other embodiments. As can be seen, FIGS. 9-10 illustrate that the optional capping layer 204 was not provided. However, configurations that include the capping layer 204 will be readily apparent in light of this disclosure.

In some embodiments, a strain transferred to a core of the fin may be proportional to cladding thickness versus fin width. In these embodiments, a ratio of fin width to cladding thickness may be chosen to achieve a desired tensile strain. For example, the ratio of fin width to cladding thickness may be 2:1. In one specific such example, the fin may be 4 nm in width with a cladding thickness of 2 nm, for instance. Stated differently, the cladding layer may include at least 1 nm of thickness for every 2 nm of fin width. However, various other embodiments include different ratios. For instance, ratios of fin width to cladding thickness may be 0.75:1, 0.9:1, 1:1, 3:1, 4:1, etc. Factors for determining the ratio to achieve a desired tensile strain may include fin thickness and cladding composition. For instance, a thicker fin may require a ratio which favors more cladding material (e.g., 2 nm of cladding thickness for every 1 nm of fin width). In another instance, material of cladding layer 214 and 224 may be SiGe (e.g., 70 atomic % Si and 30 percent Ge, or 30 atomic % Si and 70 atomic % Ge). In other embodiments, the atomic percentage of Ge in cladding layer 214 and 224 is between 25 atomic % and 100 atomic %. Accordingly, various ratios of cladding thickness to fin width will be readily apparent in light of this disclosure to achieve a desired tensile strain.

FIG. 9 illustrates a simplified representation of the structure of FIG. 8 and resulting tensile strain in the Si core of fin 210 caused by a cladding layer, in accordance with an embodiment. In the simplified representation only one fin 210 is illustrated for ease of description. Schematic 260 illustrates how the lattice constant of Ge-rich cladding (dark grey) is larger than that of the fin's Si core (~4.17% larger). This mismatch results in the interface being under strain and can cause generation of so-called dislocations within the fin, the Ge percentage should be chosen to maximize the performance improvement without forming dislocations in the device. Likewise, schematic 270 illustrates how adjacent layers of cladding material cause compressive strain in the cladding layer 214. It should be recognized, having benefit of this disclosure, that because strain has the most effect at the interface of the Si fin and the cladding, cladding techniques disclosed herein transfer a large strain to the core of the fin, and thus, enhance carrier mobility, particularly for NMOS devices. Further, it should be noted that the cladding layer may be mutually beneficial to PMOS devices as well, because the compressive strain in the cladding layer enhances carrier (hole) mobility. Accordingly, techniques and methods disclosed herein could be utilized when constructing NMOS regions as well as adjacent PMOS regions (e.g., 210 as an NMOS device and 220 as a PMOS device).

Method 100 of FIG. 1 may optionally continue with forming 116 one or more semiconductor devices as is conventionally done, in accordance with some embodiments. For example, FIG. 10 illustrates a perspective view of the structure of FIGS. 6-7 after additional processing to form a semiconductor device (e.g., after completing the replacement gate process and source/drain doping/formation). In this example embodiment, a finned transistor (e.g., a tri-gate or FinFET) has been formed. As can be seen in FIG. 10, only one fin 210 is shown for illustrative purposes. As can also be seen, fin 210 maintained first width W1 in the source and drain regions 208 and 209 and these source/drain regions were left unclad during deposition 112 (recall that these source/drain regions were masked off at the time of deposition 112 of the cladding layer).

With further reference to FIG. 10, gate electrode 262 was deposited/formed to replace dummy gate electrode 232, in this embodiment, and a gate dielectric is formed directly under gate electrode 262, as typically done (e.g., high-k gate dielectric, in some embodiments). As can also be seen, spacers 240 are formed around gate stack 260 (which generally includes gate electrode 262 and the gate dielectric) and gate stack 260 also has hardmask 270 formed thereon (which may be removed to form a metal gate contact). Gate electrode 262 and gate dielectric may be formed using any suitable technique and from any suitable materials. For example, replacement gate 260 can be formed using any of a wide variety of processes, including CVD, physical vapor deposition (PVD), a metal deposition process, and/or any combination thereof. In some embodiments, gate electrode 262 may comprise any of a wide range of materials, such as polysilicon or various suitable metals (e.g., aluminum (Al), tungsten (W), titanium (Ti), copper (Cu), or any other suitable metal or alloy). Other suitable configurations, materials, and processes for forming a replacement gate or replacement metal gate (RMG) will depend on a given application and will be apparent in light of this disclosure.

With further reference to FIG. 10, an etching process (e.g., any suitable wet or dry etching process) was performed to expose the source and drain regions 208 and 209 of fin 210 as shown. The source/drain regions 208/209 can be formed using a recess-and-replace process as previously explained. Alternatively, source/drain regions 208/209 can be formed using an ion implantation process once exposed by way of an etch process. Method 100 to form a semiconductor device (specifically, a finned transistor device) may include additional or alternative processes as will be apparent in light of this disclosure. For example, the method may continue with source/drain processing and may include the deposition of source/drain metal contacts or contact layers. Such metallization of the source and drain contacts can be carried out, for example, using a silicidation process (generally, deposition of contact metal and subsequent annealing). For instance, silicidation with nickel, aluminum, nickel-platinum or nickel-aluminum or other alloys of nickel and aluminum, or titanium with or without germanium pre-amorphization implants can be used to form a low resistance silicide/germanide.

With respect to forming a N+ doped source/drain region for NMOS (as shown), a trench is etched into the substrate (e.g., by reactive ion etching). In this example configuration, the etching is constrained on one side by the previously formed STI neighboring each source/drain region (not shown, for simplicity). Then, an embedded epitaxial source/drain can be grown which fills the trench as indicated in FIG. 10. The trench may be filled, for example, using a growth of silicon to maximize the lateral tensile strain in the core for NMOS devices or, in another example, using SiGe from 10-50% Ge for a PMOS device. The source/drain doping may be done, for instance, by in-situ doping using a Phosphine source for NMOS or diborine source for PMOS. The embedded epitaxial source/drain only grows in the trench because, for example, all other material is masked or covered. Note that if fabricating a complementary so device having both PMOS and NMOS, the PMOS side can be covered by an oxide mask during NMOS doping region formation, in some embodiments. A source/dram implant may be used in some embodiments.

Simulation showed stress state in the fin and cladding layers based on fins of varying length (e.g., multi-gate fins). For instance, in one example embodiment, a simulated stress for Ge-containing cladding on Si fin structures was determined. In particular, for a Ge cladding layer, a large compressive stress occurs in the Ge cladding and Si core of a fin along both vertical and current flow when using a fin of a length sufficient for only three gates (e.g., Ge ~3.0 GPa and Si ~3.2 (Pa). As the length of the fin is increased, and additional gates are added thereon, the stress state and mobility enhancement decline. For example, five gates yielded a stress state of −4.0 GPa for the cladding and ~2.0 GPa for the Si fin core. Likewise, nine gates yielded a stress state of ~5.5 GPa for the cladding and ~1.5 GPA for the Si core of the fin. This observed phenomenon may be the result of, for example, free surface created by a short fin allowing the cladding to expand, and thus, increase the tensile strain along the current flow direction. Accordingly, it was concluded that an additional stressor (e.g., epitaxial source/drains) would result in an enhancement that is less dependent of fin length. In some embodiments, addition of embedded Si epitaxial source/drain regions that contain edge dislocations further enhances the stress regardless of long and short (e.g., isolated devices).

Example System

Figure 11:
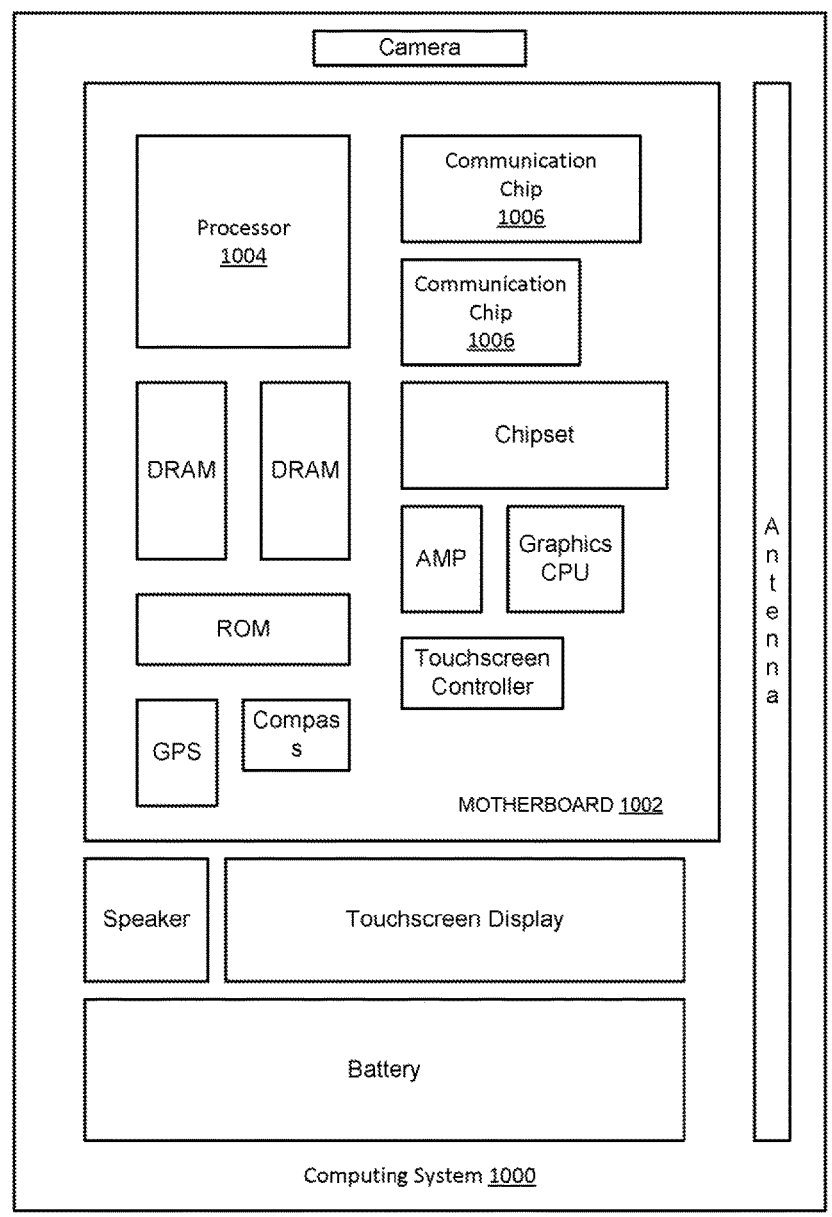
FIG. 11 illustrates a computing system implemented with one or more semiconductor devices (e.g., transistors) configured in accordance with one or more embodiments of the present disclosure.

FIG. 11 illustrates a computing system implemented with one or more integrated circuit structures configured in accordance with an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures configured with transistors having cladded channels as described herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present disclosure, the integrated circuit die of the processor 1004 includes one or more transistors having SiGe or Ge cladded channels (fully and/or partially clad) as described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more transistors having SiGe or Ge cladded channels as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic, device that processes data or employs transistor devices having cladded channels as described herein (e.g., NMOS Si fin-based transistors configured with SiGe or Ge cladded channels). As will be appreciated in light of this disclosure, various embodiments of the present disclosure can be used to improve performance on products fabricated at any process node (e.g., in the micron range, or sub-micron and beyond) by allowing for the use of transistors having stress-enhanced channel and increase mobility.

Further Example Embodiments

The following examples pertain to further embodiments, from which numerous permutations and configurations will be apparent.

Example 1 is an NMOS semiconductor device, comprising: a fin on a substrate, the fin comprising a semiconductor material and having channel region and corresponding source/drain regions adjacent thereto, wherein the fin has a first width (W1); a cladding layer of germanium or silicon germanium (SiGe) on one or more surfaces of the channel region of the fin; a gate dielectric layer over the cladding layer; a gate electrode on the gate dielectric layer; and N+ doped source/drain material in each of the source/drain regions.

Example 2 includes the subject matter of Example 1, wherein the substrate is comprised of a silicon wafer in a (110) orientation, and wherein the fin is configured with a <110> channel orientation.

Example 3 includes the subject matter of any of Examples 1-2, further comprising a capping layer between the cladding layer and the gate dielectric layer.

Example 4 includes the subject matter of any of Examples 1-3, wherein the capping layer comprises silicon.

Example 5 includes the subject matter of any of Examples 1-4, wherein the cladding layer is comprised of between 10 atomic % to 90 atomic % germanium.

Example 6 includes the subject matter of any of Examples 1-5, wherein the cladding layer covers opposing side portions and a top portion of the fin in the channel region.

Example 7 includes the subject matter of any of Examples 1-6, wherein the cladding layer has a thickness of 2 nm or less.

Example 8 includes the subject matter of any of Examples 1-7, wherein the fin width is non-uniform.

Example 9 includes the subject matter of any of Examples 1-8, wherein the base of the fin is equal to W1 and the top of the fin is a second width (W2).

Example 10 includes the subject matter of any of Examples 1-9, wherein W1 is 4 nm or greater.

Example 11 includes the subject matter of any of Examples 1-9, wherein W1 is less than or equal to 4 nm.

Example 12 includes the subject matter of any of Examples 1-11, wherein the fin includes a third width (W3), wherein W3 is an overall width based on a thickness of the cladding layer and a width of the fin.

Example 13 includes the subject matter of Example 12, wherein W3 is equal to or less than W1.

Example 14 includes the subject matter of Example 12, wherein W3 is equal to or greater than W1.

Example 15 includes the subject matter of any of Examples 1-14, wherein the cladding layer is deposited such that the ratio of cladding thickness to fin width is a ratio of at least 1 nm of cladding layer for every 2 nm of fin width.

Example 16 includes the subject matter of any of Examples 1-15, wherein the cladding layer has a non-uniform thickness.

Example 17 includes the subject matter of any of Examples 1-16, wherein the cladding layer material is free from crystalline defects.

Example 18 is an integrated circuit comprising the NMOS semiconductor device of any of Examples 1-17.

Example 19 is a complementary metal oxide semiconductor (CMOS) comprising the NMOS semiconductor device of any of Examples 1-17.

Example 20 is a mobile computing system comprising the device of any of Examples 1-17.

Example 21 is a method of forming a NMOS semiconductor device, the method comprising: forming at least one fin in or on a substrate, wherein the at least one fin has a first width (W1); depositing an insulator material in the trenches; forming as dummy gate on a channel region of the at least one fin; depositing an additional insulator material over surfaces of the at least one fin; removing the dummy gate to expose the channel region of the at least one fin; and depositing a cladding layer on one or more surfaces of the channel region of the at least one fin.

Example 22 includes the subject matter of Example 21, wherein the cladding layer is comprised of germanium (Ge) or silicon germanium (SiGe).

Example 23 includes the subject matter of any of Examples 21-22, wherein the cladding layer is comprised of between 10% to 90% Ge.

Example 24 includes the subject matter of any of Examples 21-23, wherein the substrate comprises silicon (Si).

Example 25 includes the subject matter of any of Examples 21-24, wherein forming the at least one fin in or on a substrate further includes epitaxially growing the at least one fin.

Example 26 includes the subject matter of any of Examples 21-25, wherein forming the at least one fin in or on a substrate further includes performing a trench etch to form the at least one fin.

Example 27 includes the subject matter of any of Examples 21-26, wherein forming the at least one fin in or on a substrate further includes the substrate being comprised of a (110) oriented Si wafer.

Example 28 includes the subject matter of any of Examples 21-27, wherein W1 is in the range of 5 to 20 nm.

Example 29 includes the subject matter of any of Examples 21-28, wherein W1 is equal to or greater than 10 nm.

Example 30 includes the subject matter of any of Examples 21-27, wherein W1 is equal to or less than 4 nm.

Example 31 includes the subject matter of any of Examples 21-30, further comprising thinning the at least one fin in the channel region to have a second width (W2).

Example 32 includes the subject matter of any of Examples 21-31, wherein depositing a cladding layer on one or more surfaces of the channel region of the at least one fin includes selectively depositing the cladding layer on the one or more surfaces of the channel region.

Example 33 includes the subject matter of any of Examples 21-32, wherein depositing a cladding layer on one or more surfaces of the channel region of the at least one fin includes depositing cladding layer on each surface of the fin, and at least some of the cladding extends below the insulation deposited in the trenches.

Example 34 includes the subject matter of any of Examples 21-33, wherein depositing a cladding layer on one or more surfaces of the channel region of the at least one fin includes etching the cladding layer to a desired thickness after deposition.

Example 35 includes the subject matter of any of Examples 21-34, wherein the cladding layer is 2 nm thick or less.

Example 36 includes the subject matter of any of Examples 21-35, wherein depositing a cladding layer on one or more surfaces of the channel region of the at least one fin includes the fin having a third width (W3).

Example 37 includes the subject matter of Example 36, wherein W3 is equal to or less than W1.

Example 38 includes the subject matter of Example 36, wherein W3 is equal to or greater than W1.

Example 39 includes the subject matter of any of Examples 21-38, further comprising selecting a thickness of the cladding layer such that for every 1 nm of fin width 2 nm of cladding layer is deposited.

Example 40 includes the subject matter of any of Examples 21-39, further comprising depositing a capping layer on the cladding layer.

Example 41 includes the subject matter of any of Examples 21-40, wherein the capping layer comprises silicon.

Example 42 is a mobile computing system, comprising: a printed circuit board; a processor operatively coupled to the printed circuit board; a memory operatively coupled to the printed circuit board and in communication with the processor; and a wireless communication chip operatively coupled to the printed circuit board and in communication with the processor; wherein at least one of the processor, wireless communication chip, and/or the memory comprises a NMOS semiconductor device including: a fin on a substrate, the fin comprising a semiconductor material and having channel region and corresponding source/drain regions adjacent thereto; a cladding layer of germanium (Ge) or silicon germanium (SiGe) on one or more surfaces of the channel region of the fin; a gate dielectric layer over the cladding layer; a gate electrode on the gate dielectric layer; and N+ doped source/drain material in each of the source/drain regions.

Example 43 includes the subject matter of Example 42, wherein the NMOS semiconductor device further includes a capping layer between the cladding layer and the gate dielectric layer, and the capping layer comprises silicon.

Example 44 includes the subject matter of any of Examples 41-42, wherein the fin is silicon, and the cladding layer is SiGe.

Example 45 includes the subject matter of any of Examples 41-44, wherein the source/drain regions include embedded epitaxially grown silicon.

Example 46 includes the subject matter of any of Examples 41-45, wherein the fin includes a first width (W1) throughout the fin.

Example 47 includes the subject matter of any of Examples 41-45, wherein the fin includes a first width (W at a base of the substrate and a second width (W2) at a top of the fin.

Example 48 includes the subject matter of any of Examples 41-47, wherein W1 is greater than 10 nm and W2 is 10 nm or less.

Example 49 includes the subject matter of any of Examples 41-47, wherein W2 is 4 nm or less.

Example 50 includes the subject matter of any of Examples 41-49, wherein the fin includes a third width (W3), wherein W3 is an overall width of the fin based on a thickness of the cladding layer and a width of the fin.

Example 51 includes the subject matter of Example 50, wherein W3 includes a ratio of at least 1 nm of cladding layer for every 2 nm of fin width.

Example 52 includes the subject matter of any of Examples 41-51, wherein the cladding layer has a thickness of 2 nm or less.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A semiconductor device, comprising:
   a fin including silicon;

a layer including germanium over a portion of the fin, the layer having a thickness of 2 nanometers (nm) or less, wherein the portion of the fin includes tensile strain and has a width of 4 nm or less between two portions of the layer;

a gate structure over the layer, the gate structure including a gate electrode and a gate dielectric, the gate dielectric between the layer and the gate electrode;

a source region including semiconductor material and n-type dopant; and a drain region including semiconductor material and n-type dopant, the portion of the fin between the source and drain regions.

2. The semiconductor device of claim 1, wherein the layer includes 10 atomic % to 90 atomic % germanium.

3. The semiconductor device of claim 1, wherein the layer includes compressive strain.

4. The semiconductor device of claim 1, wherein the fin also includes germanium.

5. The semiconductor device of claim 1, wherein another portion below the portion of the fin includes a width greater than 10 nm.

6. The semiconductor device of claim 1, wherein the source and drain regions include epitaxial silicon.

7. The semiconductor device of claim 1, wherein the portion of the fin has a width of 4 nm between the two portions of the layer and the layer has a thickness of 2 nm.

8. The semiconductor device of claim 1, wherein the layer also includes silicon.

9. An integrated circuit comprising the semiconductor device of claim 1.

10. A complementary metal oxide semiconductor (CMOS) circuit comprising the semiconductor device of claim 1.

11. The semiconductor device of claim 1, wherein the tensile strain included in the portion of the fin comprises at least 2.0 gigapascals (GPa) of stress.

12. The semiconductor device of claim 1, wherein the fin extends from a substrate, the substrate comprised of a silicon wafer in a (110) orientation, and wherein the fin includes a <110> channel orientation.

13. The semiconductor device of claim 12, wherein the fin is native to the substrate.

14. An integrated circuit including at least one transistor device, the integrated circuit comprising:

a fin consisting essentially of silicon;

a layer including germanium over a portion of the fin, the layer having a thickness of 2 nanometers (nm) or less, wherein the portion of the fin includes tensile strain and has a width of 4 nm or less between two portions of the layer;

a gate structure over the layer, the gate structure including a gate electrode and a gate dielectric, the gate dielectric between the layer and the gate electrode;

a source region including semiconductor material and n-type dopant; and a drain region including semiconductor material and n-type dopant, the portion of the fin between the source and drain regions.

15. The integrated circuit of claim 14, wherein the layer includes 25 atomic % to 100 atomic % germanium.

16. The integrated circuit of claim 14, wherein the source and drain regions include epitaxial silicon.

17. The integrated circuit of claim 14, wherein the tensile strain included in the portion of the fin comprises at least 2.0 gigapascals (GPa) of stress.

18. The integrated circuit of claim 14, wherein the fin extends from a substrate, the substrate comprised of a silicon wafer in a (110) orientation, and wherein the fin includes a <110> channel orientation.

19. The integrated circuit of claim 18, wherein the fin is native to the substrate.

20. An integrated circuit including at least one transistor device, the integrated circuit comprising:

a fin including silicon;

a layer consisting essentially of silicon and germanium over a portion of the fin, the layer having a thickness of 2 nanometers (nm) or less, wherein the portion of the fin includes tensile strain and has a width of 4 nm or less between two portions of the layer;

a gate structure over the layer, the gate structure including a gate electrode and a gate dielectric, the gate dielectric between the layer and the gate electrode;

a source region including semiconductor material and n-type dopant; and a drain region including semiconductor material and n-type dopant, the portion of the fin between the source and drain regions.

21. The integrated circuit of claim 20, wherein the fin consists essentially of silicon.

22. The integrated circuit of claim 20, wherein the source and drain regions include epitaxial silicon.

23. The integrated circuit of claim 20, wherein the tensile strain included in the portion of the fin comprises at least 2.0 gigapascals (GPa) of stress.

24. The integrated circuit of claim 20, wherein the fin extends from a substrate, the substrate comprised of a silicon wafer in a (110) orientation, and wherein the fin includes a <110> channel orientation.

25. The integrated circuit of claim 24, wherein the fin is native to the substrate.

* * * * *